US00RE38822E

(19) United States
(12) Reissued Patent
Aarts et al.

(10) Patent Number: US RE38,822 E
(45) Date of Reissued Patent: Oct. 11, 2005

(54) CIRCUIT, AUDIO SYSTEM AND METHOD FOR PROCESSING SIGNALS, AND A HARMONICS GENERATOR

(75) Inventors: Ronaldus M. Aarts, Eindhoven (NL); Stephanus P. Straetemans, Eindhoven (NL)

(73) Assignee: Koninklijke Philips Electronics N.V., Eindhoven (NL)

(21) Appl. No.: 10/013,135

(22) Filed: Dec. 6, 2001

Related U.S. Patent Documents

Reissue of:
(64) Patent No.: 6,111,960
Issued: Aug. 29, 2000
Appl. No.: 08/851,302
Filed: May 5, 1997

(30) Foreign Application Priority Data

Aug. 5, 1996 (EP) ..... 96201263-9

(51) Int. Cl.[7] ..... H03G 3/00
(52) U.S. Cl. ..... 381/61; 381/98
(58) Field of Search ..... 381/59, 61, 96, 381/98

(56) References Cited

U.S. PATENT DOCUMENTS

| | | | | |
|---|---|---|---|---|
| 4,463,650 A | | 8/1984 | Rupert | 84/1.19 |
| 4,532,848 A | | 8/1985 | Deutsch | 84/1.19 |
| 5,388,159 A | | 2/1995 | Sakata | 381/61 |
| 5,438,625 A | | 8/1995 | Klippel | 381/96 |
| 6,111,960 A | * | 8/2000 | Aarts et al. | 381/61 |

FOREIGN PATENT DOCUMENTS

| | | | |
|---|---|---|---|
| EP | 0546619 A3 | 6/1993 | H04S/1/00 |
| EP | 0546619 B1 | 6/1993 | H04S/1/00 |
| EP | 0546619 A2 | 6/1993 | H04S/1/00 |

* cited by examiner

*Primary Examiner*—Xu Mei
(74) *Attorney, Agent, or Firm*—Edward W. Goodman

(57) ABSTRACT

A circuit, audio system and method are presented for processing an audio signal, in which a frequency band is selected, harmonics are generated from the selected signal by a harmonics generator, wherein the harmonics are scaled by a level detected in at least a part of the spectrum of the audio signal related to the selected frequency band. Furthermore, a harmonic generator is presented for generating arbitrary harmonics of an input signal.

17 Claims, 5 Drawing Sheets

CIRCUIT, AUDIO SYSTEM AND METHOD FOR PROCESSING SIGNALS, AND A HARMONICS GENERATOR

Matter enclosed in heavy brackets [ ] appears in the original patent but forms no part of this reissue specification; matter printed in italics indicates the additions made by reissue.

BACKGROUND OF THE INVENTION

1. Field of the Invention

The invention relates to a circuit for processing an audio signal, comprising:

an input for receiving the audio signal and an output for supplying an output signal, electing means coupled to the input for selecting a frequency band of the audio signal, harmonics generator coupled to the selecting means for generating harmonics of the selected signal, adding means coupled to the input as well as to the harmonics generator for supplying a sum of the input signal and the generated harmonics to the output.

The invention also relates to an audio reproduction system comprising such a circuit.

The invention further relates to a method for processing an audio signal, comprising the steps of:

selecting a frequency band of the audio signal, generating harmonics of the selected signal, supplying a sum of the audio signal and the generated harmonics.

2. Description of the Related Art

A circuit according to the preamble is known from European Patent Application EP-A 546 619. In the known circuit, a low frequency band of an input signal is selected and supplied to a harmonics generator for generating harmonics of the selected signal. In this way, low-frequency perception of the audio signal is improved upon. In the known circuit a full-wave rectifier is used as harmonics generator. A drawback of the full-wave rectifier is that it generates only even harmonics.

SUMMARY OF THE INVENTION

An object of the invention is to provide a circuit for processing an audio signal, wherein any non-linear device may be used as a harmonics generator for generating any selection of harmonics desired.

A circuit according to the invention is characterized in that the circuit further comprises:

detecting means for detecting a level of at least a part of the spectrum of the audio signal including the selected frequency band, and scaling means for scaling the generated harmonics in response to said level.

The invention is based on the recognition that in the prior art, the full-wave rectifier only produces even harmonics having a fixed amplitude relation with the fundamental harmonic. Through the measures of the invention, any non-linear device can be used as a harmonics generator, thereby allowing the freedom to generate any combination of odd and even harmonics and its amplitude relation to the fundamental harmonic. However, the use of any arbitrary harmonics generator will result in a different low-frequency perception at low input signals compared to high input levels. This is caused by the fact that in a non-linear device, such as a diode, the generated harmonics have amplitudes which are non-linearly related to the amplitude of the fundamental harmonic, whereas, the amplitudes of the harmonics generated by the full-wave rectifier are linearly related to the amplitude of the fundamental harmonic. By using the measure according the invention, the generated harmonics can be scaled properly, thereby allowing the freedom of choice of using any non-linear device as harmonics generator without a level-dependent low-frequency perception.

An embodiment of the circuit, according to the invention, is characterized in that the input is coupled to the adding means via a filter having a high-pass transfer function for selecting frequencies higher than those which are selected by the selecting means. By this measure, no overlap in spectrum of the signals supplied to the adding means takes place, thus avoiding an extra and unnatural boosting of those frequencies, which would otherwise be present due to the overlap of frequency ranges.

An embodiment of the circuit, according to the invention, is characterized in that an input of the detecting means is coupled to an output of the selecting means. Through this measure, the amplitude of the generated harmonics is directly related to the amplitude of the input signal of the harmonics generator. In addition to that, in this way the selecting means serves a double purpose, both for the detecting of the level, and for selecting the signal for the harmonics generator. This results in a more economic circuit.

An embodiment of the circuit, according to the invention, is characterized in that the circuit comprises at least one further signal stage, coupled between the input and a further input of the adding means, the signal stage comprising:

a further selecting means coupled to the input, having a selection characteristic for selecting a part of the input signal in frequency adjacent to the selected signal of the selecting means, a further harmonics generator coupled to the further selecting means for generating harmonics of the signal selected by the further selecting means, further detecting means coupled to the further selecting means for detecting a level of the by the further selecting means selected signal, and further scaling means for scaling the by the further harmonics generator generated harmonics in response to said level.

By providing two (or more) parallel paths for generating harmonics, the effect of intermodulation is reduced. This intermodulation results if two or more strong low frequencies are present at the input of the harmonics generator. By selecting the pass-bands of the selecting means sufficiently narrow and providing a plurality of harmonics generators, each supplied by respective selecting means having adjacent pass-bands, the chances of two strong low frequencies present at the input of one of the harmonics generator is substantially reduced. By providing each individual signal path with its individual detecting means, the harmonics generated in each path will have an amplitude related to only the signal component from which the harmonics are generated. This results in a more natural sound.

An embodiment of the circuit, according to the invention, is characterized in that the harmonics generator comprises a plurality of cascaded multipliers, each having two inputs and an output, the inputs of the first of the cascade of multipliers being coupled to an input of the harmonics generator, a remaining input of each of the remaining multipliers being coupled to the input of the harmonics generator, an output of each of the multipliers being coupled via a coefficient to a respective input of further adding means, the input of the harmonics generator being coupled via a coefficient to an input of the adding means, the adding means further receiving a constant value, an output of the adding means supplying the generated harmonics.

Through this measure, a versatile harmonics generator is created. By varying the number of multipliers and the values of the coefficients, an arbitrary number of harmonics can be generated with freely determinable amplitudes.

An embodiment of the circuit, according to the invention, is characterized in that the harmonics generator comprises a zero-crossing detector and a waveform generator for generating a waveform in response to the detected zero crossings, an amplitude of the generated waveform being controlled by the level supplied by the detecting means.

By dividing the harmonics generator into a zero-crossing detector and waveform generating means, it is possible to generate harmonics on the basis of the detected zero crossings, with fixed amplitudes. By choosing the appropriate waveform, it is possible to adjust the number and amplitudes of the harmonics. By controlling the amplitudes with the detected level, the generated harmonics are adapted to the audio signal.

An embodiment of the circuit, according to the invention, is characterized in that the waveform generator comprises a current source controlled by the level supplied by the detecting means, a capacitance and means for charging and discharging the capacitance in response to the detected zero crossings. This is a simple and advantageous embodiment of a waveform generator for use in the invention.

An embodiment of an audio system comprising at least one speaker, according to the invention, is characterized in that the selected frequency band of the selecting means is non-overlapping with the high-pass characteristic of the speaker. By this measure, the circuit is adapted to compensate the low-frequency deficiencies of the speaker, as only those frequencies are treated by the circuit which the speaker can not reproduce adequately.

A method, according to the invention, is characterized in that the method further comprises the step of scaling the generated harmonics in response to a level of at least a part of the spectrum of the audio signal including the selected frequency band.

The invention further provides a harmonics generator for generating harmonics of an input signal, comprising a plurality of cascaded multipliers, each having two inputs and an output, the inputs of the first of the cascade of multipliers being coupled to an input of the harmonics generator, a remaining input of each of the remaining multipliers being coupled to the input of the harmonics generator, an output of each of the multipliers being coupled via a coefficient to a respective input of further adding means, the input of the harmonics generator being coupled via a coefficient to an input of the adding means, the adding means further receiving a constant value, an output of the adding means supplying the generated harmonics. By selecting an appropriate number of multipliers and selecting appropriate values for the coefficients, it is possible to generate an arbitrary number of harmonics with individually selectable amplitudes.

The invention also provides a harmonics generator for generating harmonics of an input signal, comprising a zero-crossing detector for detecting zero crossings in the input signal applied to the harmonics generator, and a waveform generator for generating a waveform in response to the detected zero crossings, an amplitude of the generated waveform being controlled by a level of the input signal.

This is a simple implementation of a harmonics generator. By generating a waveform in response to the detected zero crossings, harmonics are generated, which will have a constant amplitude. Now the scaling of the generated harmonics can be done by controlling the amplitude of the harmonics by the level of the input signal. In this way, the amplitudes of the harmonics can be made proportional to the level of the input signal. By choosing the appropriate waveform (square/sawtooth/triangle, etc.), the desired harmonics can be generated.

An embodiment of the harmonics generator is characterized in that the waveform generator comprises a current source controlled by the level supplied by the detecting means, a capacitance, and means for charging and discharging the capacitance in response to the detected zero crossings. This provides a simple way of generating the desired waveform in response to the detected zero crossings. These harmonics generators may also be used in the known circuit or even separately from this circuit or the circuits described previously.

BRIEF DESCRIPTION OF THE DRAWINGS

The above object and features of the present invention will be more apparent from the following description of the preferred embodiments with reference to the drawings, wherein.

In the figures, identical parts are provided with the same reference numbers.

DESCRIPTION OF THE PREFERRED EMBODIMENTS

Figure 1:
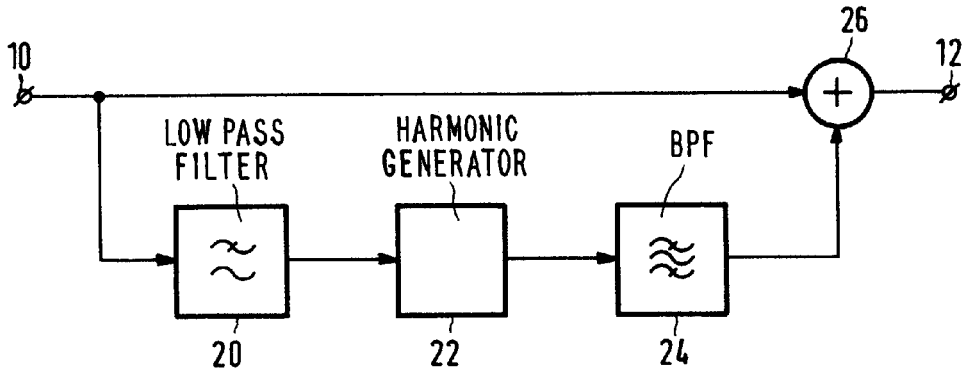
FIG. 1 shows a known circuit for improving low-frequency perception.

FIG. 1 shows a known circuit for improving low-frequency perception. The circuit comprises an input 10 for receiving an audio signal and an output 12 for supplying an output signal. The circuit further comprises selecting means 20 coupled to the input 10, a harmonics generator 22 coupled to the selecting means 20, a band-pass filter 24 coupled to the harmonics generator 22, and adding means 26, coupled to the input 10 and the band-pass filter 24, for supplying the sum of the audio signal and the output signal of the band-pass filter 24 to the output 12. In EP-A 546 619, the selecting means 20 is a low-pass filter, but it may also be a band-pass filter for selecting a part of the frequency spectrum of the audio signal. The band-pass filter 24 serves to eliminate any residual low and high frequency components, but is, however, not essential to the circuit. A full-wave rectifier is used as a harmonics generator 22 for generating harmonics of a signal applied to its input. By inclusion of these harmonics in the audio signal, the impression of more low frequency content in the audio signal is given, thus giving an improved low-frequency perception. The harmonics generator 22 used in EP-A 546 619 only generates even harmonics. It is possible to replace the full-wave rectifier by another non-linear device, which generates also uneven harmonics. A diode, for example, exhibits such non-linear behavior. But now, the impression of increased low-frequency content depends on the level of the audio signal.

Figure 2:
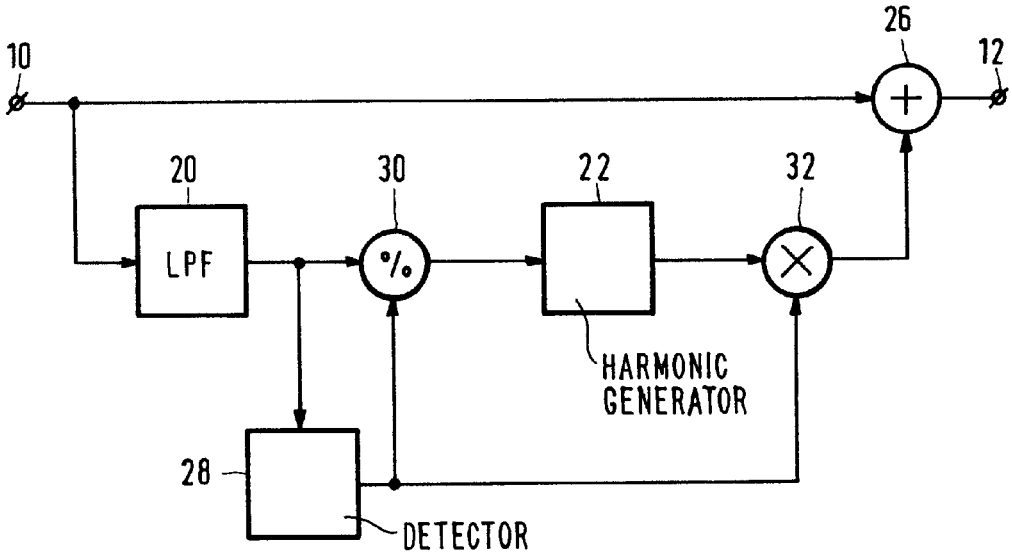
FIG. 2 shows a block diagram of a first circuit according to the invention.

FIG. 2 shows a block diagram of a first circuit according to the invention. Compared with FIG. 1 the following changes have been made:

the band-pass filter 24 is deleted, detecting means 28 are added, having an input coupled to an output of the selecting means 20, a divider 30 is inserted between the selecting means 20 and the harmonics generator 22, having an input coupled to an output of the selecting means 20 and an input coupled to an output of the detecting means 32, and an output coupled to the harmonics generator 22, a multiplier 32 is inserted between the harmonics generator 22 and the adding means 26, having an input coupled to an output of the harmonics generator 22, and a further input coupled to the output of the detecting means 28 and an output coupled to the adding means 26.

The detecting means 28 is a level detector for detecting a level of at least a part of the spectrum of the audio signal related to, or rather, including, the frequency band selected by the selecting means 20. This detected level may be a amplitude level, a power level, a peak level, an average level, etc. The divider 30 together with the multiplier 32 constitute scaling means for scaling the generated harmonics in response to the detected level, supplied by the detecting means 28. By the inclusion of the detecting means and the scaling means according to the invention the above-mentioned level-dependency of the low-frequency impression is substantially reduced. In the present invention it is namely recognized that this level-dependency is caused by the non-linear behavior of the harmonics generator 22. For example, if the harmonics generator produces a second and a third harmonic of its input signal, this means also that the amplitude of the second harmonic will depend on the amplitude of the input signal to the second power. For the third harmonic, this dependency is to the third power. This means that the ratio of the amplitudes of the second and third harmonics is not constant, but a function of the amplitude of the input signal. Thus, at low signal levels, the amplitudes of the generated harmonics will have a different relationship with the fundamental harmonic than at high signal levels. This explains that the low-frequency impression depends on the amplitude of the input signal. In the circuit of FIG. 2, first the input signal to the harmonics generator 22 is normalized, i.e., made substantially amplitude-independent. This is done in the divider 30 by dividing an output signal of the selecting means 20 by the detected level supplied by the detecting means 28. Thus, the input signal of the harmonics generator 22 is normalized, i.e., made substantially level-independent. As a result of this, the amplitudes of the generated harmonics will always have substantially the same constant ratio. In multiplier 32, the harmonics supplied by the harmonics generator 22 are multiplied by the detected level supplied again by the detecting means 28. By making the generated harmonics again dependent on the amplitude of the input signal, the generated harmonics are brought into their proper amplitude relation with the audio signal. Preferably, the level of the input signal applied to the harmonics generator 22 is used for this scaling. However, this is not essential, as long as the harmonics are scaled in response to a level that is directly related to or includes at least a part of the audio signal. This means that the input of the detecting means 28 may also be coupled to the input 10, instead of the output of the selecting means 20. By using the measures of the invention, it is possible to use any non-linear device with the desired non-linear behavior as harmonics generator, as the ratio of the amplitudes of these harmonics will always be substantially independent of the input signal level. This freedom allows the choice of a harmonics generator 22 which generates any desired harmonics (odd and/or even) and its proper amplitude, in correspondence with the desired effect, and is no longer restricted to either a level-dependent low-frequency perception or a limited choice of generated harmonics (as generated by a full-wave rectifier).

Figure 3:
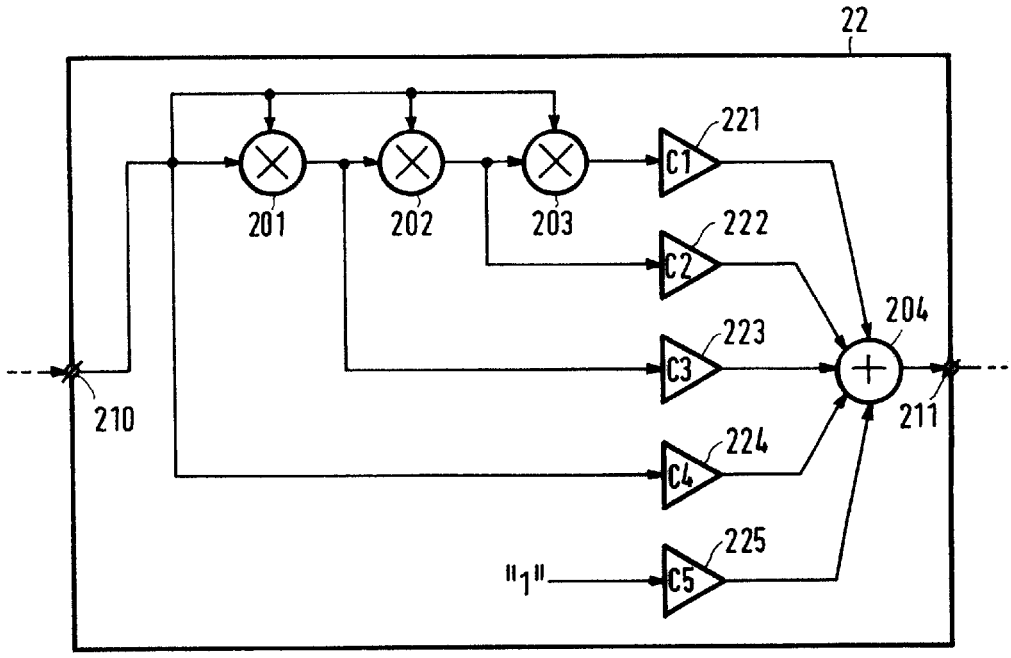
FIG. 3 shows an embodiment of a harmonics generator for use in the present invention.

FIG. 3 shows an embodiment of a harmonics generator for use in the present invention. The harmonics generator 22 comprises an input 210, an output 211, coefficients 221 . . . 225, a plurality of cascaded multipliers 201 . . . 203, each having two inputs and an output, and an adder 204. An input of each of the multipliers is coupled to an input 210 of the harmonics generator 22. A further input of multiplier 201 is also coupled to the input 210. The remaining inputs of multipliers 202 and 203 are coupled to the outputs of multipliers 201 and 202, respectively. Each of the outputs of the multiplier 203 . . . 201 is coupled via respective coefficients 221 . . . 223 to the adder 204. The input 210 is also coupled to the adder 204 via a coefficient 224. In addition, a constant value of 1 is also coupled to the adder 204 via a coefficient 225. The value of C5 is chosen so that no DC appears at the output of the adder 204. The coefficients 221 . . . 225 multiply their respective input signals with respective values C1 . . . C5. By setting the coefficient values C1 . . . C5 at their appropriate values, any mix of first to third harmonics can be generated, accordingly. If more or less harmonics are required, the number of multipliers and coefficients can be increased or decreased. By making the coefficients C1 . . . C5 adjustable, the generated harmonics can be adapted in number and magnitude to achieve the required low-frequency effect or they can be adapted to the low-frequency imperfections of a speaker coupled to the circuit. The harmonics generator shown allows a free choice in number and amplitude of the harmonics generated.

Figure 4:
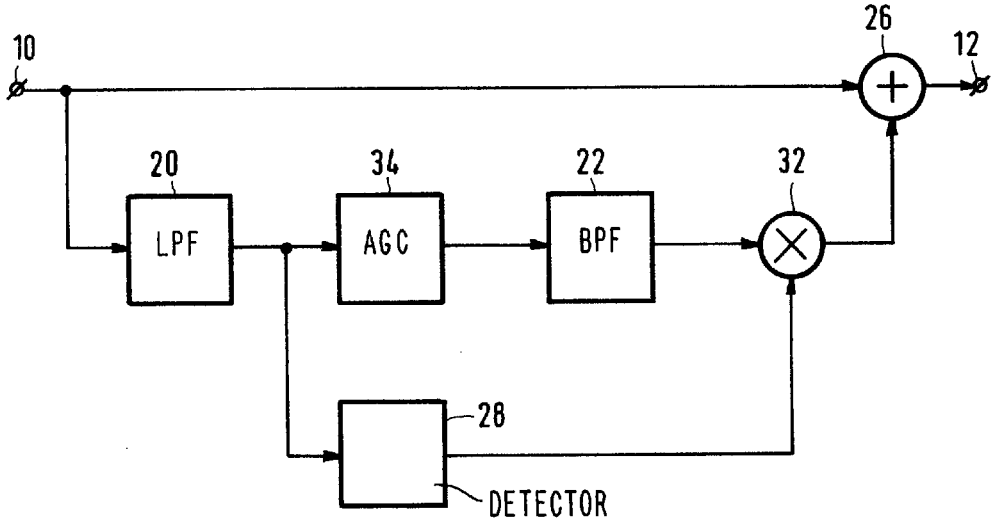
FIG. 4 shows a block diagram of a second circuit according to the invention.

FIG. 4 shows a diagram of a second embodiment of a circuit according to the invention. Compared with FIG. 2, the divider 30 is, in effect and purpose, replaced by an automatic gain control circuit 34 for normalizing the input signal of the harmonics generator 22, and the output of the detecting means 28 is now only coupled to an input of the multiplier 32. Automatic gain control circuits are generally known and need not be discussed in detail.

Figure 5:
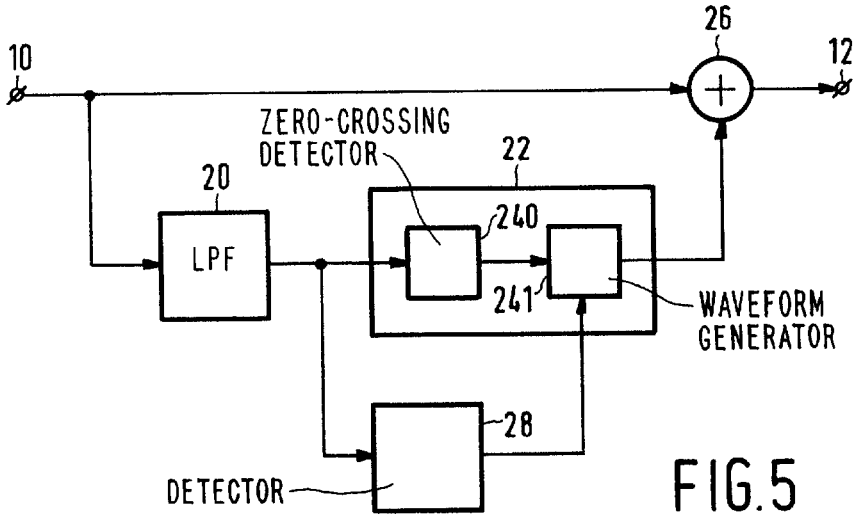
FIG. 5 shows a block diagram of a third circuit according to the invention.

FIG. 5 shows a diagram of a third embodiment of a circuit according to the invention. The circuit of FIG. 3 comprises the selecting means 20 coupled to the input 10, the harmonics generator 22 coupled to the selecting means 20, the detecting means 28 coupled to the selecting means 20, the adding means 26 coupled to the input 10, and the harmonics generator 22 for supplying a sum signal to the output 12. The harmonics generator 22 comprises a zero-crossing detector 240 for detecting zero crossings in a signal supplied by the selecting means 20, and a waveform generator 241 for generating a waveform based on the detected zero crossings, the waveform having an amplitude related to the detected level supplied by the detecting means 28. Preferably, the amplitude of the waveform is made proportional to the detected level. For this purpose the waveform generator 241 is coupled to both zero-crossing detector 240 and the detecting means 28. By generating a waveform in response to the detected zero crossings, it is possible to generate harmonics having a predetermined and constant amplitude relation with each other. By selecting the appropriate waveform, it is possible to select which harmonics are generated and which not, and even which amplitude relation there should be. For example, a square waveform only comprises odd harmonics of a predetermined magnitude, whereas a triangular waveform also comprises odd harmonics but with different magnitudes. However, a sawtooth waveform comprises both odd and even harmonics. By scaling the generated waveform in response to the detected level, the generated harmonics will fit in with the audio signal. Any conventional zero-crossing detector can be used for the zero-crossing detector 240, for instance, a limiter, etc. In case a limiter is used, the output signal of such a limiter would be a square-wave with a period of 2 zero crossings. This output signal itself may be used as output signal of the harmonics generator 22, without passing it through a waveform generator 241. In this case, block 241 may be replaced by a simple multiplier for adapting the amplitude of the output signal of the zero-crossing detector 240 to the detected level.

Figure 6:
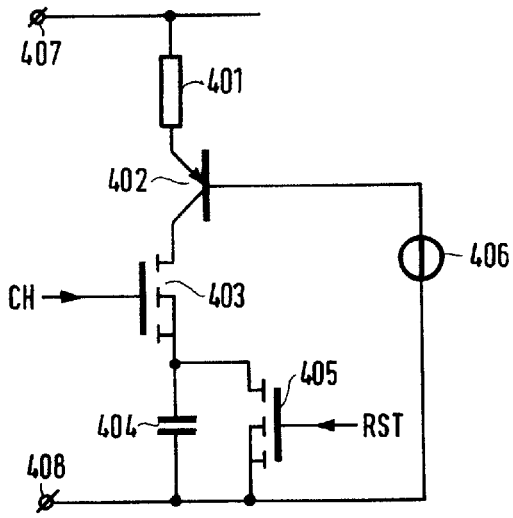
FIG. 6 shows a first embodiment of a waveform generator for use in the circuit of FIG. 5.

FIG. 6 shows a first embodiment of a waveform generator for use in the circuit of FIG. 5. The waveform generator comprises a resistor 401, a main current path of a PNP transistor 402, a switch transistor 403 and a capacitor 404, placed in series. Parallel to the capacitor 404 a second switch transistor 405 is placed. The transistor 402 is biased with a voltage source 406 coupled to the base of the transistor. Transistors 403 and 405 function as switches, activated by signals CH and RST, respectively. The voltage source has a value of Vb+Vx, wherein Vb is a bias voltage and Vx is a voltage related to the detected level supplied by the detecting means 28. Resistor 401, transistor 402 and voltage source 406 constitute a current source, supplying a current proportional to the detected level through the main current path of transistor 402. When transistor 403 is activated by a charge signal CH, the capacitor 404 will be charged by the current supplied by transistor 402. When transistor 403 is deactivated, the charging of the capacitor 404 is stopped. By activating transistor 405 with a reset signal RST, the capacitor 404 is immediately discharged. The signals CH and RST are derived from the zero crossing detector 240. The voltage across the capacitor has a waveform, comprising harmonics of the input signal of the zero-crossing detector 240, and having an amplitude in response to the detected level. In the discussion of FIGS. 8a–8h, the signals CH and RST and the voltage Vx will be dealt with in more detail in connection with the shape of the waveforms generated.

Figure 7:
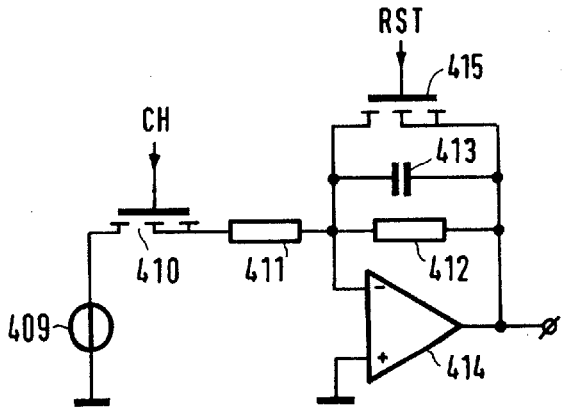
FIG. 7 shows a second embodiment of a waveform generator for use in the circuit of FIG. 5.

FIG. 7 shows a second embodiment of a waveform generator for use in the circuit of FIG. 5. The waveform generator now comprises an operational amplifier 414, having its positive input grounded. A resistor 412, a capacitor 413 and a switch transistor 415 are placed in parallel with each other and couple the negative input of the operational amplifier 414 to its output. A voltage source 409 is coupled, via a series circuit of switching transistor 410 and resistor 411, to the negative input of the operational amplifier 414. Switching transistor 410 receives the charging signal CH and switching transistor 415 receives the reset signal RST. The voltage source 409 has a value of Vx. Upon activation of transistor 410 with the charging signal CH, the capacitor 413 is charged with a current proportional to the detected level, and upon activation of transistor 415, the capacitor 413 is immediately discharged. The circuit of FIG. 7 operates in a similar way as the circuit of FIG. 6, but now the output of the operational amplifier supplies the generated harmonics having an amplitude in response to the detected level.

FIGS. 8a–8h show diagrams of various waveforms generated in response to a sinusoidal input signal applied to the zero crossing detector for use in the present invention. In these diagrams, the solid lines depict the sinusoidal input and the dashed lines depict the styled waveforms generated by the waveform generator 241. t0 . . . t4 are the moments the input signal goes through zero. In general, different waveforms can be generated depending on:

- different moments for resetting the capacitor voltage using the reset signal RST,
- different moments for charging the capacitor using the charge signal CH,
- the amplitude of the current as related to voltage Vx: the voltage Vx may for example be chosen to be proportional to the input signal (in this case the input signal and the output signal of the detecting means 28 differ only in amplitude), supplied to the zero crossing detector, or to the absolute value of said input signal (now the detecting means 28 comprises a rectifier). Other variants are also possible.

Figure 8A:
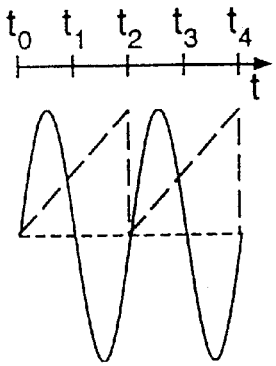
FIGS. 8a–8h show diagrams of various waveforms generated in response to a sinusoidal input signal applied to the zero-crossing detector for use in the present invention.
Figure 8B:
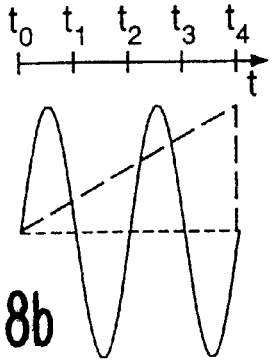
Figure 8C:
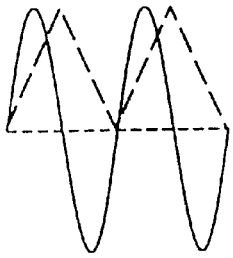
Figure 8D:
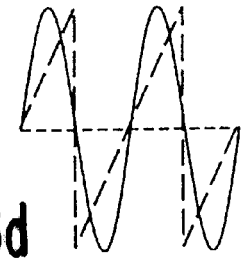
Figure 8E:
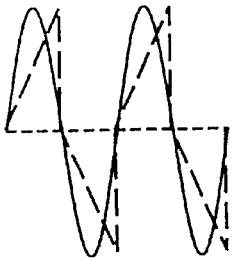
Figure 8F:
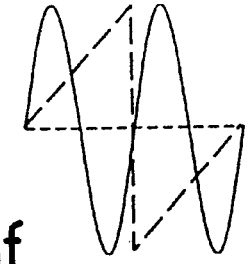
Figure 8G:
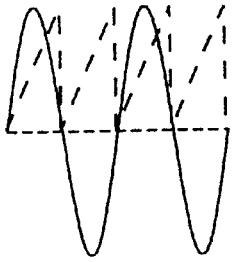
Figure 8H:
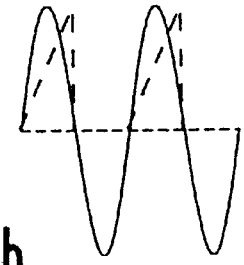

For the generation of the waveforms of FIGS. 8a–8h, the signal CH may be constantly activated. This means that in that case transistors 403 and 410 may be replaced by short circuits. For the waveforms of FIGS. 8a and 8b, a reset pulse RST is generated every second (t2, t4) and fourth (t4) zero crossing, respectively. For FIG. 8e, a reset pulse is generated at every zero crossing. This reset pulse RST is only a short pulse, generated at a moment the input signal goes through zero. For the waveforms of FIGS. 8e, 8d and 8f, no reset signal is required. In these cases transistors 405 and 415 may be deleted. For the waveform of FIG. 8h, the reset pulse is generated every other zero-crossing, but now, either the reset pulse RST lasts until the next zero crossing, or the charge signal CH is inactive every second zero crossing, lasting until the next zero crossing, or both. In this latter case, the charge signal CH is the inverted reset signal RST. For waveforms of FIGS. 8a, b, f, g and h, the voltage Vx is a function of the absolute value of the input signal supplied to the zero-crossing detector 240. For the waveforms of FIGS. 8e, 8d and 8e the voltage Vx is proportional to the value of the input signal, including its sign. The difference between the waveforms of FIG. 8e and FIG. 8e, is that for FIG. 8e no reset signal active, but for FIG. 8e, a reset signal is active at each zero crossing (t0 . . . t4). For the waveform of FIG. 8h, it does not matter whether Vx is a function of the value of the input signal or its absolute value as the charging of the capacitor only takes place during the same phase of the input signal. The waveform of FIG. 8d can be derived from the waveform of FIG. 8e in the following manner. The waveform of FIG. 8e is measured across the capacitor, and this measured value then receives the sign of the input signal. This can be done by multiplying the measured value with a signal representing the sign of the input signal. Such a signal can be obtained directly at the output of a non-inverting limiter, which may serve as zero-crossing detector 240. For generating the waveform of FIG. 8f, the charging current of capacitor may be reversed in sign every second zero crossing. No reset signal RST is required. A signal for indicating the direction of the charging current may be obtained by dividing the signal representing the sign of the input signal (as described previously) by a factor 2. The generation of the previously described pulses for the reset signal RST lie well within the abilities of the skilled person and need not be explained in detail. The waveforms of FIGS. 8a–8h are only intended in an illustrative and not a limiting sense.

Figure 9:
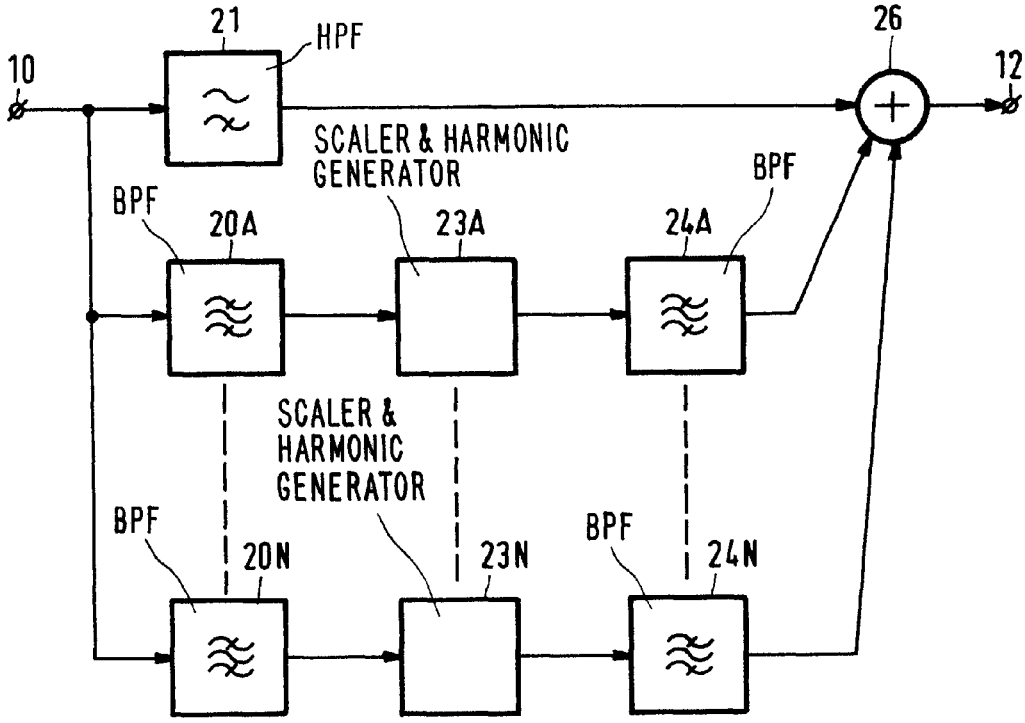
FIG. 9 shows a block diagram of a third circuit according to the invention.

FIG. 9 shows a diagram of a fourth embodiment of a circuit according to the invention. The circuit comprises a high-pass filter 21 coupled to input 10, a plurality of band-pass filters 20A . . . 20N coupled to the input 10, a plurality of blocks 23A . . . 23N coupled to the band-pass filters 20A . . . 20N, respectively, a plurality of further band-pass filters 24A. . . 24N, coupled to the blocks 23A . . . 23N, respectively, outputs of the plurality of further band pass-filters 24A . . . 24N and the high-pass filter 21 being coupled to the adding means 26. The blocks 23A. . . 23N each comprise scaling means and a harmonics generator. For example, a block may comprise the blocks 22 and 28 as shown in FIG. 5, or the blocks 30, 22, 32 and 28 as shown in FIG. 2, or even the blocks 34, 22, 32 and 28 as shown in FIG. 4. The band-pass filters 20A . . . 20N preferably have band-pass characteristics, that lie adjacent to each other. For example, band-pass filter 20A may select frequencies from 20–30 Hz, band-pass filter 20B may select frequencies from 30–40 Hz, etc. In this way, for each small frequency band selected by one of the band-pass filters 20A . . . 20N, harmonics are generated. An advantage of the division into small bands is that less intermodulation distortion will occur during the generation of the harmonics. When no division takes place, it is possible that more than one strong low frequency component may be present at the input of the harmonics generator. The harmonics generator 22 will generate harmonics of not only these low frequency components, but also produce mixing products, wherein the low frequency components are mixed with each other. The harmonics generated from these mixing products are not present in the original audio signal and may be perceived as distortion. The division of the spectrum in small bands and assigning separate harmonics generators to each band will substantially prevent such intermodulation from taking place. The combined band-pass filters 20A . . . 20N thus select a part of the low-pass spectrum of the audio signal. The high-pass filter 21 preferably selects the high part of the spectrum of the audio signal, which is not selected by the band-pass filter 20A . . . 20N. In this way, no overlap between the frequency bands of the high-pass filter 21 and the plurality of band-pass filters 20A . . . 20N is present, thereby avoiding an over-emphasis on the low frequency components in the output signal at output 12. The further band-pass filters 24A. . . 24N are similar in function as the band-pass filter 24 shown in FIG. 1. The band-pass characteristic of one of the filters 24A . . . 24N is chosen in correspondence with the band-pass characteristic with an associated filter from the filters 20A . . . 20N. When, for example, filter 20A has a band-pass characteristic ranging from 20–30 Hz, then the characteristic of filter 24A may range from 20–120 Hz. Thus the upper cut-off frequency of filter 24A is preferably a multiple of the upper cut-off frequency of filter 20A. The same goes for the lower cut-off frequencies of these filters. It is not necessary for the lower cut-off frequencies of the filters 24A . . . 24N to be equal to the lower cut-off frequencies of the filters 20A . . . 20N. It is possible to use only one detecting means 28 to scale the harmonics in each block 23A . . . 23N in response to the same detected level. However, it is preferable to use a separate detecting means for each block. The embodiments described here show a method for improving low frequency perception in an audio signal. By selecting a frequency band of the audio signal, generate harmonics of this selected signal and scaling the generated harmonics in response to a level of at least a part of the spectrum of the audio signal, and supplying the sum of the audio signal and the harmonics as output signal, such a method is realized having all the benefits according the invention as described in relation with the embodiments of the invention as illustrated previously. The invention is of special advantage for audio reproduction systems, which comprise small speakers, for example, portable radios, CD players, cassette recorders, or even television sets. By adding a circuit according to the invention, the perception of low-frequencies is improved upon.

Figure 10:
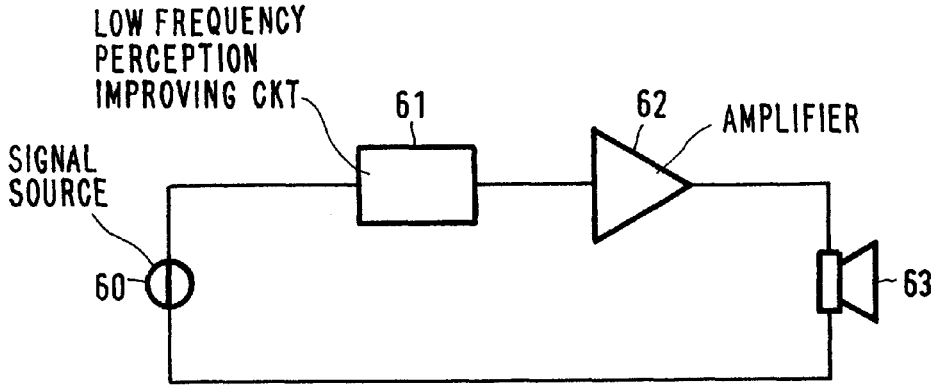
FIG. 10 shows a diagram of an audio system according to the invention.

FIG. 10 shows a diagram of an audio system according to the invention. The audio system comprises a signal source 60 coupled to the circuit 61 for improving low-frequency perception, the circuit 61 being coupled to an amplifier 62, the amplifier 62 being coupled to a speaker 63. The signal source [61] *60* may derive its signal from a CD, a cassette or a received signal or any other audio source. The circuit 61 can be anyone of the circuits of FIGS. 2, 4, 5 or 9. The invention is particularly useful for use in conjunction with a speaker 63[.] which exhibits a high-pass characteristic. This means that low frequencies can not be reproduced adequately by the speaker 63. Preferably, the frequency band of the selecting means 20 of the circuit [62] *61* is made non-overlapping with the high-pass characteristic of the speaker 63. Thus, harmonics are generated of only those frequencies which are attenuated by the speaker 63 or not even present in the acoustical signal produced by the speaker 63. The audio [means] *system* may be a portable radio or CD player or any audio device comprising speakers which are limited in low-frequency reproduction, including even television sets with built-in speakers, or multimedia PCs or even telephones. The order of circuit 61 and amplifier 62 can be reversed if desired. Furthermore, the audio system may include means for generating other sound effects, etc., which are independent of and not material to the present invention.

The invention is by no means limited to the examples given above. For example, a band-pass filter 24 may be incorporated also in the circuits of FIGS. 2, 4 and 5, directly before the adding means 26, similar as in FIG. 1. Furthermore, instead of a direct coupling of the input 10 to the adding means 26, as shown in FIGS. 1, 2, 4 and 5, a high-pass filter may be inserted, as shown in FIG. 9. In addition to that, the harmonics generator is not limited to the example given. Other non-linear devices, such as, diodes or transistors, may also be used to generate harmonics. The waveform generator is not limited to generating waveforms as shown in FIGS. 8a–8h. A person skilled in the art will be able to realise other waveforms with other simple waveform generators as well, based on the detected zero crossings, such as square-waves or more complex waveforms. Furthermore, the harmonics generator shown in FIGS. 3 and 5 may also be used in the circuit known from EP-A 546 619 or even separately from such circuits.

What is claimed is:

1. A circuit comprising:

selecting means for selecting a frequency band of an audio input signal;

harmonics generator means for generating harmonics of signals in the selected frequency band of the audio input signal to provide generated harmonics;

adding means for supplying a sum of the audio input signal and scaled harmonics;

level detecting means for detecting a level of at least a part of the spectrum of the audio input signal including the selected frequency band; and scaling means for scaling the generated harmonics in response to the detected level to provide the scaled harmonics, and wherein the harmonics generator comprises:

a zero-crossing detector for detecting zero crossings in signals including signals of the selected frequency band; and a waveform generator for generating a waveform in response to detected zero crossings, an amplitude of the generated waveform being controlled by the level supplied by the level detecting means, and wherein the waveform generator comprises:

a current source controlled by the detected level supplied by the level detecting means;

a capacitance; and means for charging and discharging the capacitance in response to the detected zero crossings.

2. The circuit as claimed in claim 1, wherein an input of the level detecting means communicates with an output of the selecting means.

3. The circuit as claimed in claim 1, wherein said circuit further comprises at least one further signal stage, including:

further selecting means for selecting a part of the input signal adjacent, in frequency, to the selected frequency band of the selecting means;

a further harmonics generator for generating harmonics of signals in the part of the audio input signal selected by the further selecting means;

further detecting means for detecting a level of the signals in the part of the audio input signal selected by the further selecting means; and further scaling means for scaling the harmonics generated by the further harmonics generator in response to the level detected by the further detecting means, and wherein the adding means further adds the scaled harmonics from the further scaling means for supplying the sum.

4. The circuit as claimed in claim 1, in which the selecting means includes a low-pass filter or a band-pass filter.

5. The circuit as claimed in claim 1, wherein the added input audio signal includes signals with frequencies higher than the selected frequency band.

6. An harmonics generator comprising:

a zero-crossing detector for detecting zero crossings in an input signal applied to the harmonics generator; and a waveform generator for generating a waveform in response to the detected zero crossings, an amplitude of the generated waveform being controlled by a level of the input signal, whereby harmonics of the input signal are generated, wherein said waveform generator comprises:

a current source controlled by a level signal;

a capacitance; and means for charging and discharging the capacitance in response to the detected zero crossings.

7. A circuit comprising:

selecting means for selecting a frequency band of an audio input signal and having a low-pass transfer function;

harmonics generator means for generating harmonics of signals in the selected frequency band of the audio signal to provide generated harmonics;

adding means for supplying a sum of a filtered audio signal and scaled harmonics;

level detecting means for detecting a level of at least a part of the spectrum of the audio signal including the selected frequency band;

scaling means for scaling the generated harmonics in response to the detected level to provide the scaled harmonics; and a filter for filtering the audio input signal and having a high-pass transfer function for selecting frequencies higher than those which are selected by the selecting means to provide the filtered audio signal, wherein the harmonics generator comprises:

a zero-crossing detector for detecting zero crossings in signals including signals in the selected frequency band; and a waveform generator for generating a waveform in response to detected zero crossings, an amplitude of the generated waveform being controlled by the detected level supplied by the level detecting means, and wherein the waveform generator comprises:

a current source controlled by the detected level supplied by the level detecting means;

a capacitance; and means for charging and discharging the capacitance depending on the detected zero crossings.

8. The circuit as claimed in claim 7, wherein an input of the detecting means communicates with an output of the selecting means.

9. The circuit as claimed in claim 7, wherein the circuit further comprises at least one further signal stage including:

further selecting means for selecting a part of the input signal adjacent, in frequency, to the selected frequency band of the selecting means;

a further harmonics generator communicating with the further selecting means for generating harmonics of signals in the part of the audio input signal selected by the further selecting means;

further level detecting means for detecting a level of the signals in at least the part of the audio input signal selected by the further selecting means; and further scaling means for scaling the harmonics generated by the further harmonics generator in response to the level detected by the further level detecting means, and wherein the adding means also adds the scaled harmonics from the further scaling means for supplying the sum.

10. A circuit comprising:

selecting means for selecting a frequency band of an audio input signal, the selected frequency band being lower than the highest signal frequencies of the audio input signal;

harmonics generator means for generating harmonics of signals in the selected frequency band of the audio input signal to provide generated harmonics;

adding means for supplying a sum of the audio input signal and scaled harmonics;

level detecting means for detecting a level of at least a part of the spectrum of the audio input signal including the selected frequency band; and scaling means for scaling the generated harmonics in response to the detected level to provide the scaled harmonics, wherein the harmonics generator comprises:

a zero-crossing detector for detecting zero crossings in signals including signals of the selected frequency band; and a waveform generator for generating a waveform in response to detected zero crossings, an amplitude of the generated waveform being controlled by the level supplied by the level detecting means, and wherein the waveform generator comprises:

a current source controlled by the detected level supplied by the level detecting means;

a capacitance; and means for charging and discharging the capacitance in response to the detected zero crossings.

*11. A circuit for processing an audio signal, said audio signal processing circuit comprising:*

*an input for receiving an audio signal and an output for supplying an output signal;*

*selecting means coupled to the input, said selecting means selecting a frequency band of the audio signal;*

*harmonics generating means coupled to the selecting means for generating harmonics of signals in the selected frequency band of the audio signal;*

*adding means coupled to the input of said audio signal processing circuit and to an output of the harmonics generating means for supplying a sum of the audio signal and the generated harmonics to the output of the circuit;*

*detecting means for detecting a level of at least a part of the spectrum of the audio signal including the selected frequency band; and*

*scaling means for scaling the generated harmonics in response to said detected level;*

*wherein the selecting means has a low-pass transfer function, and the input of the audio signal processing circuit is coupled to the adding means via a filter having a high-pass transfer function for selecting frequencies higher than those which are selected by the selecting means.*

*12. The audio signal processing circuit as claimed in claim 11, wherein an input of the detecting means is coupled to an output of the selecting means.*

*13. The audio signal processing circuit as claimed in claim 12, wherein the audio signal processing circuit further comprises at least one further signal stage coupled between the input of the audio signal processing circuit and a further input of the adding means, the further signal stage comprising:*

*a further selecting means coupled to the input, said further selecting means having a selection characteristic for selecting a part of the input signal adjacent, in frequency, to the selected frequency band of the selecting means;*

*a further harmonics generating means coupled to the further selecting means for generating harmonics of signals in the part of the input signal selected by the further selecting means;*

*further detecting means coupled to the further selecting means for detecting a level of the signals in the part of the input signal selected by the further selecting means; and*

*further scaling means for scaling the harmonics generated by the further harmonics generating means in response to said level detected by said further detecting means.*

*14. The audio signal processing circuit as claimed in claim 11, wherein the harmonics generating means comprises:*

*coefficient scaling means;*

*further coefficient scaling means;*

*further adding means; and*

*a plurality of cascaded multipliers each having two inputs, the inputs of a first multiplier of the plurality of cascaded multipliers being coupled to the input of the harmonics generating means, an input of each of the remaining multipliers being coupled to the input of the harmonics generating means, and the remaining input of each of the remaining multipliers being coupled to an output of a preceding multiplier, and the outputs of the plurality of cascaded multipliers being coupled, via the coefficient scaling means, to respective inputs of the further adding means, the input of the harmonics generating means being coupled, via the further coefficient, scaling means, to a further input of the further adding means, the further adding means further receiving a constant value, and an output of the further adding means supplying the generated harmonics.*

*15. The audio signal processing circuit as claimed in claim 11, wherein the harmonics generating means comprises:*

*a zero-crossing detector; and*

*a waveform generator for generating a waveform in response to detected zero crossings, an amplitude of the generated waveform being controlled by the level supplied by the detecting means.*

*16. The audio signal processing circuit as claimed in claim 15, wherein the waveform generator comprises:*

*a current source controlled by the level supplied by the detecting means;*

*a capacitance; and*

*means for charging and discharging the capacitance in response to the detected zero crossings.*

*17. An audio system comprising:*

*a signal source for providing an audio signal;*

*a circuit for improving low-frequency perception coupled to said signal source for receiving said audio signal; and*

*a loudspeaker coupled to an output of said circuit for improving low-frequency perception,*

*wherein said circuit for improving low-frequency perception comprises:*

*an input for receiving the audio signal and an output for supplying an output signal;*

*selecting means coupled to the input for selecting a frequency band of the audio signal;*

*harmonics generating means coupled to the selecting means for generating harmonics of signals in the selected frequency band of the audio signal;*

*adding means coupled to the input and to an output of the harmonics generating means for supplying a sum of the input signal and the generated harmonics to the output of the circuit for improving low-frequency perception;*

*detecting means for detecting a level of at least a part of the spectrum of the audio signal including the selected frequency band; and*

*scaling means for scaling the generated harmonics in response to said detected level;*

*wherein the selecting means has a low-pass transfer function, and the input of the circuit for improving low-frequency perception is coupled to the adding means via a filter having a high-pass transfer function for selecting frequencies higher than those which are selected by the selecting means.*

* * * * *